United States Patent
Murakami et al.

(10) Patent No.: US 8,057,904 B2
(45) Date of Patent: Nov. 15, 2011

(54) GAS-BARRIER FILM AND DEVICE

(75) Inventors: Tomoo Murakami, Kanagawa (JP); Takashi Kobayashi, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 854 days.

(21) Appl. No.: 12/119,129

(22) Filed: May 12, 2008

(65) Prior Publication Data

US 2008/0318034 A1    Dec. 25, 2008

(30) Foreign Application Priority Data

May 14, 2007   (JP) .................... 2007-128389

(51) Int. Cl.
- B32B 27/08 (2006.01)
- B32B 27/30 (2006.01)
- B32B 7/12 (2006.01)

(52) U.S. Cl. ............ 428/423.7; 428/429.9; 428/336

(58) Field of Classification Search .......... 428/336, 428/423.1, 423.7, 429.9, 500
See application file for complete search history.

(56) References Cited

U.S. PATENT DOCUMENTS

| | | | | |
|---|---|---|---|---|
| 6,482,523 B1 * | 11/2002 | Morikawa et al. | ......... | 428/423.1 |
| 2002/0048681 A1 * | 4/2002 | Hidaka et al. | ......... | 428/483 |
| 2002/0183181 A1 * | 12/2002 | Hayashi et al. | ......... | 493/194 |
| 2004/0018364 A1 * | 1/2004 | Ota et al. | ......... | 428/447 |
| 2004/0105981 A1 | 6/2004 | Yializis | | |
| 2005/0032928 A1 * | 2/2005 | Koyama | ......... | 522/184 |
| 2005/0171229 A1 | 8/2005 | Mirone et al. | | |
| 2005/0267230 A1 * | 12/2005 | Esaki et al. | ......... | 522/172 |
| 2006/0251905 A1 | 11/2006 | Arakawa | | |
| 2007/0212533 A1 | 9/2007 | Jones et al. | | |

FOREIGN PATENT DOCUMENTS

| | | |
|---|---|---|
| JP | 2003-053881 A | 2/2003 |
| JP | 2005279974 A | 10/2005 |
| JP | 2005313560 A | 11/2005 |

* cited by examiner

Primary Examiner — Thao T. Tran
(74) Attorney, Agent, or Firm — Birch, Stewart, Kolasch & Birch, LLP (57) ABSTRACT

Disclosed is a barrier film capable of maintaining a high water vapor barrier property when folded. The film is characterized in that it has a structure in which an easy adhesive layer, an organic layer and an inorganic layer are laminated in that order on one surface or both surfaces of a plastic film, wherein a center liner average roughness of the surface of the organic layer on the inorganic layer side is at least 0.5 nm, and the organic layer contains a resin which is obtained by curing an acrylic monomer having at least two acryloyl groups and at least two urethane groups in one molecule as a polymerizable component.

14 Claims, 1 Drawing Sheet

FIG. 1

GAS-BARRIER FILM AND DEVICE

FIELD OF THE INVENTION

The present invention relates a gas-barrier laminate film (referred to as "barrier film" in the specification) usable in an electronic device material and an optical material and having a good gas-barrier property and to a method thereof.

DESCRIPTION OF THE RELATED ART

Heretofore, a barrier film fabricated by forming a thin metal oxide film of aluminium oxide, magnesium oxide or silicon oxide on the surface of a plastic film is widely used for wrapping or packaging articles that require shielding from various gases such as water vapor or oxygen and for wrapping or packaging edibles, industrial articles and medicines for preventing them from being deteriorated.

Recently, in the field of liquid-crystal display devices and organic EL devices (organic electroluminescent devices), plastic films are being used in place of glass substrates that are heavy and readily cracked or broken. As applicable to a roll-to-roll system, plastic films are advantageous in point of cost. However, plastic films are problematic in that their gas-barrier property is not good as compared with that of glass substrates. Therefore, when a plastic film is used in a liquid-crystal display device, then water vapor may penetrate into the liquid-crystal cell, thereby causing display failures.

For solving the problem, it is known to form an organic/inorganic laminate on a plastic film, thereby using the resulting barrier film.

For example, JP-A-2003-53881 discloses a barrier film comprising an organic layer having a thickness of 0.01 to 1 μm and an inorganic layer on a plastic film. In JP-A-2003-53881, a polymer of acrylate is quoted as a material of the organic layer and the organic layer is formed in vacuum. JP-A-2003-53881 also discloses that the barrier property thereof does not deteriorate when folded.

JP-A-2005-313560 discloses a barrier film comprising an organic layer having a thickness of 0.1 to 10 μm and an inorganic layer having a thickness of 20 to 100 nm on a plastic substrate. In JP-A-2005-313560, a polymer of acrylate is quoted as a material of the organic layer; and the inorganic layer is composed of SiO, SiN or SiON.

JP-A-2005-279974 discloses a barrier film in which an organic layer and an inorganic layer are laminated on a plastic film. JP-A-2005-279974 discloses the barrier film of which surface roughness Ra of the inorganic layer or the organic layer is 0.7 nm or less and in which a polymer of acrylate is used as the organic layer. JP-A-2005-279974 also discloses that the barrier film has folding resistance.

SUMMARY OF THE INVENTION

However, unless the organic layer of the barrier film in JP-A-2003-53881 is formed in vacuum, a high barrier property of 0.1 g/m²·day or less cannot be achieved and, furthermore, when the barrier film is folded in curvature radius of 15 mm or less, the barrier property thereof cannot be maintained. The barrier film in JP-A-2005-313560 has a water vapor permeability of 0.09 g/m²·day or more, being unsatisfactory for the barrier property. Furthermore, for the barrier film in JP-A-2005-279974, a high barrier property of 0.01 g/m²·day or less and a satisfying folding resistance have not been achieved.

To solve the problems of such related arts, the present inventors have an object to provide a barrier film which maintains a high water vapor barrier property when folded.

The present inventors have assiduously studied and, as a result, have found that the problems of the related arts can be solved by providing an easy adhesive layer between an organic layer containing a resin which is obtained by polymerizing a urethane acrylate and a plastic film, and holding a center liner average roughness low. That is, the following invention is provided as means to solve the problems.

(1) A barrier film having a structure in which an easy adhesive layer, an organic layer and an inorganic layer are laminated in that order on one surface or both surfaces of a plastic film, wherein a center liner average roughness of a surface of the organic layer on the inorganic layer side is 0.5 nm or less, and the organic layer contains a resin which is obtained by curing an acrylic monomer having at least two acryloyl groups and at least two urethane groups in one molecule as a polymerizable component.

(2) The barrier film according to (1), wherein the easy adhesive layer contains polyester resin as a binder.

(3) The barrier film according to (1), wherein the easy adhesive layer comprises a first layer adjacent to the substrate and a second layer on the first layer.

(4) The barrier film according to (1), wherein the easy adhesive layer comprises a first layer adjacent to the substrate and a second layer on the first layer, the first layer contains a polyester resin as a binder, and the second layer contains an acrylic resin or a urethane resin as a binder.

(5) The barrier film according to (1), wherein the easy adhesive layer contains a carbodiimide compound.

(6) The barrier film according to (1), wherein the barrier film after folded in curvature radius of 5 mm has a water vapor permeability of at 0.01 g/m²·day or less.

(7) The barrier film according to (1), wherein the acrylic monomer is represented by the following formula (I):

Formula (1)

wherein Acr is an acryloyl group or a methacryloyl group, n is an integer of 1 to 5, L¹ is a bivalent linking group and L² is a linking group having valence of (n+1).

(8) The barrier film according to (1), wherein the acrylic monomer is represented by the following formula (1):

Formula (1)

wherein Acr is an acryloyl group or a methacryloyl group, n is an integer of 1 to 5, L¹ is a bivalent linking group and L² is a linking group having valence of (n+1); and L¹ is selected from -continued and $L^2$ is selected from (9) The barrier film according to (1), wherein the polymerizable component of the organic layer further contains a monofunctional monomer.

(10) The barrier film according to (1), wherein the organic layer has a thickness of 50 to 5000 nm.

(11) The barrier film according to (1), wherein the inorganic layer has a thickness of 10 to 300 nm.

(12) An device comprising a barrier film according to (1).

(13) An organic EL device comprising a barrier film according (1).

The barrier film of the invention makes it possible to maintain a high water vapor barrier property even if the barrier film is folded. The device of the invention has a high permanence.

DESCRIPTION OF SPECIFIC EMBODIMENTS

The barrier film and the device of the invention are described in detail hereinunder. The description made hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof.

<Barrier Film and Production Method for the Barrier Film>
(Characteristic)

The barrier film of the invention is characterized in that it has a structure in which an easy adhesive layer, an organic layer and an inorganic layer are laminated in that order on one surface or both surfaces of a plastic film, and a center liner average roughness of the surface of the organic layer on the inorganic layer side is 0.5 nm or less, and the organic layer contains a resin which is obtained by curing an acrylic monomer having at least two acryloyl groups and at least two urethane groups in one molecule as a polymerizable component.

(Plastic Film)

In the barrier film of the invention, the substrate film is generally a plastic film. Not specifically defined in point of the material and the thickness thereof, the plastic film usable herein may be any one capable of supporting a laminate of an easy adhesive layer, an organic layer and an inorganic layer; and it may be suitably selected depending on the use and the object thereof. Concretely, the plastic film includes metal supports (e.g., aluminium, copper, stainless), and thermoplastic resins such as polyester resin, methacryl resin, methacrylic acid-maleic anhydride copolymer, polystyrene resin, transparent fluororesin, polyimide, fluoropolyimide resin, polyamide resin, polyamidimide resin, polyetherimide resin, cellulose acylate resin, polyurethane resin, polyether ether ketone resin, polycarbonate resin, alicyclic polyolefin resin, polyarylate resin, polyether sulfone resin, polysulfone resin, cycloolefin copolymer, fluorene ring-modified polycarbonate resin, alicyclic-modified polycarbonate resin, fluorene ring-modified polyester resin, acryloyl compound.

In case where the barrier film of the invention is used as a substrate of a device such as an organic EL device to be mentioned hereinunder, it is desirable that the plastic film is formed of a heat-resistant material. Concretely, the plastic film is preferably formed of a heat-resistant transparent material having a glass transition temperature (Tg) of not lower than 100° C. and/or a linear thermal expansion coefficient of at least 40 ppm/° C. Tg and the linear expansion coefficient may be controlled by the additives to the material. The thermoplastic resin of the type includes, for example, polyethylene naphthalate (PEN: 120° C.), polycarbonate (PC: 140° C.), alicyclic polyolefin (e.g., Nippon Zeon's Zeonoa 1600: 160° C.) polyarylate (PAr: 210° C.), polyether sulfone (PES: 220° C.), polysulfone (PSF: 190° C.), cycloolefin copolymer (COC, compound described in JP-A 2001-150584: 162° C.), fluorene ring-modified polycarbonate (BCF-PC, compound described in JP-A 2000-227603: 225° C.), alicyclic-modified polycarbonate (IP-PC, compound described in JP-A 2000-227603: 205° C.), acryloyl compound (compound described in JP-A 2002-80616: 300° C. or more) (the parenthesized data are Tg). In particular, for high transparency, use of alicyclic polyolefin is preferred.

When the barrier film of the invention is used as combined with a polarizing plate, a barrier layer side of the barrier film, in which the barrier layer side is a side of which a laminate comprising at least one inorganic layer and at least one organic layer is formed, is directed at the inside of the cell; and the barrier film is preferably provided on the innermost side of the cell, that is, the barrier film is preferably adjacent to the device. In such a case, a retardation value is important, because the barrier film is provided in the inside of the cell inner than the polarizing plate. In such embodiment, it is preferable that a barrier film comprising a substrate having a retardation value of 10 nm or less is laminated on a circular polarizing plate (¼ wavelength plate+(½ wavelength plate)+liner polarizing plate) or that a barrier film comprising a substrate applicable as a ¼ wavelength plate and having a retardation value of 100 nm to 180 nm is combined with a linear polarizing plate.

The substrate having a retardation value of 10 nm or less include a cellulose triacetate (Fuji Film, Fuji TAC), polycarbonate (Teijin Chemicals Ltd., Pureace; Kaneka, ELMECH), cycloolefin polymer (JSR Corp., ARTON; ZEON Corp., ZEONOR), cycloolefin copolymer (Mitsui Chem. Inc., APEL (pellet); Polyplastic Com., TOPAS), polyallylate (Unitika, U100 (pellet)), transparent polyimide (Mitsubishi Gas Chem. Inc., Neoprium).

As a ¼ wavelength plate, usable is a film which was adjusted to a desired retardation by stretching the above film.

Since the barrier film of the invention is usable in devices such as organic EL devices, the plastic film is transparent, or that is, its light transmittance is generally at least 80%, preferably at least 85%, more preferably at least 90%. The light transmittance may be measured according to the method described in JTS-K7105. Concretely, using an integrating sphere-type light transmittance meter, a whole light transmittance and a quantity of scattered light are measured, and the diffusive transmittance is subtracted from the whole transmittance to obtain the intended light transmittance of the sample.

Even when the barrier film of the invention is used in displays, it does not always require transparency in a case where it is not disposed on the viewers' side. Accordingly in such a case, a nontransparent material may be used for the plastic film. The nontransparent material includes, for example, polyimide, polyacrylonitrile, known liquid-crystal polymer.

Not specifically defined, the thickness of the plastic film for use in the barrier film of the invention may be suitably selected depending on its use. Typically, the thickness may be from 1 to 800 μm, preferably from 10 to 200 μm. The plastic film may have a functional layer such as a transparent conductive layer, a primer layer, etc. The functional layer is described in detail in JP-A 2006-289627, paragraphs 0036 to 0038. Examples of other functional layers than those are a matting agent layer, a protective layer, an antistatic layer, a planarizing layer, an adhesiveness improving layer, a light shielding layer, an antireflection layer, a hard coat layer, a stress relaxing layer, an antifogging layer, an anti-soiling layer, a printable layer, etc.

(Easy Adhesive Layer)

In the invention, an easy adhesive layer may have a single layer constitution or a two layers constitution. The single layer constitution achieves satisfying adhesiveness, and however, the two layers constitution achieves stronger adhesiveness to improve the folding resistance.

(1) Easy Adhesive Layer Having a Single Layer Constitution

When an easy adhesive layer of the invention is a single layer constitution, then the layer is directly laminated on a plastic film. The layer is necessary to contain a binder and preferably contains a carbodiimide crosslinking agent, which is described in the easy adhesive structure having a two layers constitution. The layer further may include matting agent, surfactant, antistatic addictive and particles for controlling flexibility, if necessary.

The binder of the easy adhesive layer having a single layer constitution of the invention is not defined, and however, usable are an acrylic resin, a polyurethane resin, a polyester resin and a rubber resin.

The acrylic resin is a polymer composed of an acrylic acid, a methacrylic acid or a derivatives thereof. Specifically, examples of the acrylic resin include a polymer which is obtained by copolymerizing acrylic acid, methacrylic acid, methylmethacrylate, ethylacrylate, butylacrylate, 2-ethylhexylacrylate, acrylamide, acrylonitrile, hydroxylacrylate and the like, as a main component, with a monomer copolymerizable therewith, for example, styrene and divinylbenzene.

The polyurethane resin is a generic term of a polymer having a urethane bonding in the main chain, generally obtained by reacting polyisocyanate with polyol.

Examples of the polyisocyanate include TDI, MDI, NDI TODI, HDI and IPDI and examples of the polyol include ethylene glycol, propylene glycol, glycerin and hexane triol.

Furthermore, in the invention, usable is the polymer which is obtained by subjecting a urethane polymer obtained by reacting polyisocyanate with polyol to chain elongation treatment, thereby increasing the molecular weight thereof. The polyisocyanate, polyol and chain elongation treatment, as described above, for example, are described in "Polyurethane Resin Hand Book" which was edited by IWATA Keizi and issued by Nikkan Kogyo Shimbun on 1987.

The polyester resin is a generic term of a polymer having an ester bonding in the main chain, generally obtained by reacting polycarboxylic acid and polyol. Examples of the polycarboxylic acid include fumaric acid, itaconic acid, adipic acid, sebacic acid, terephthalic acid and isophthalic acid and examples of the polyol include the above examples thereof. The polyester resin and the material thereof are, for example, described in "Polyester Resin Hand Book" which was edited by TAKIYAMA Eiichiro and issued by Nikkan Kogyo Shimbun on 1988.

The rubber resin of the invention is a diene synthetic rubber among synthetic rubbers. Specific examples include polybutadiene, styrene-butadiene copolymer, styrene-butadiene-acrylonitrile copolymer, styrene-butadiene-divinylbenzene copolymer, butadiene-acrylonitrile copolymer, polychloroprene. The rubber resin of the invention is, for example, described in "Synthesis Rubber Hand Book" which is edited by KANBARA Syu et al. and issued by Asakura Syoten on 1967.

Specifically preferably, the binder of the easy adhesive layer having a single layer constitution of the invention is polyester resin from the view point of adhesiveness with a polyester substrate.

Specifically preferably, the polymer of the binder of the easy adhesive layer having a single layer constitution of the invention is a polymer having a carboxyl group on the molecule among the above-mentioned polymers.

When the binder of the easy adhesive polymer of the single layer constitution of the invention is used, the above polymer may be dissolved in an organic solvent or be used as aqueous dispersion. Since environment impact is small, the binder is preferably coated by aqueous type coating using aqueous dispersion. For the aqueous dispersion, usable are commercially available polymers as follows: Super Flex 830, 460, 870, 420 420NS (polyurethane manufactured by Dai-ichi Kogyo Seiyaku Co., Ltd.), VONDIC 1370NS, 1320NS, HW APX-101H, AP40 (F) (polyurethane manufactured by DIC Corp.), Jurymer ET325, ET410, SEK301 (acrylic manufactured by Nihon Junyaku Co., Ltd.), Boncoat AN117, AN226 (acrylic manufactured by DIC Corp.), Luxter DS616, DS807 (styrene-butadiene rubber manufactured by DIC Corp.), Nippor LX110, LX206, LX426, LX433 (styrene-butadiene rubber manufactured by ZEON Corp.), Nippor LX513, LX1551, LX550, LXX571 (acrylic nitrile-butadiene rubber manufactured by ZEON Corp.) FineTex Es650, Es2200 (polyester manufactured by DIC Corp.), Vylonal MD1400, MD1480 (polyester manufactured by Toyobo).

For the polymer used as the binder of the easy adhesive layer having a single layer constitution of the invention, one or more different types thereof may be ether singly or as combined.

The molecular weight of the polymer used as the binder of the easy adhesive layer having a single layer constitution of the invention is not specifically defined, and generally, preferred is weight-average molecular weight of 3,000 to 1,000, 000. When the weight-average molecular is 3,000 or more, then strength of the coating layer tends to be higher, and when the weight-average molecular weight is 1,000,000 or less, then the surface of the coating tends to be better.

The easy adhesive layer having a single layer constitution of the invention preferably contains the after-mentioned carbodiimide crosslinking agent. The carbodiimide crosslinking agent preferably contains 1 to 100% by mass relative to the binder of the easy adhesive layer having a single layer constitution, more preferably 5 to 50% by mass. When the addition amount is 1% by mass or more, then falling of particles from the layer to be formed tends to be sufficiently prevented. When the addition amount is 100% by mass or less, then the surface to be coated tends to be better.

The matting agent usable in the easy adhesive layer having a single layer constitution of the invention is preferably either of organic particles and inorganic particles. For example, polymer particles such as polystyrene, polymethylmethacrylate, silicone resin, benzoguanamine resin and inorganic particles such as silica, calcium carbonate, magnesium oxide, magnesium carbonate may be used. Of those, polystyrenem, polymethylmethacrylate and silica are preferable from the viewpoints of improvement of the slipping property and the cost thereof.

The average particle diameter of the matting agent for use in the invention is preferably 0.3 to 12 μm, more preferably 0.5 to 9 μm. When the average particle diameter is 0.3 or more, then the slipping property tends to be more sufficient. When the average particle diameter is 12 μm or less, then the device to be formed tends to excel in display appearance quality.

Depending on the average particle diameter, the addition amount of the matting agent of the invention is preferably 0.1 to 30 mg/m$^2$, more preferably 0.5 to 20 mg/m$^2$. When the addition amount thereof is 0.1 mg/m$^2$ or more, then the easy adhesive layer to be formed tends to be improved in slipping property. When the addition amount thereof is 30 mg/M$^2$ or less, then the device to be formed tends to excel in display appearance quality.

The surfactant usable in the easy adhesive layer having a single layer constitution of the invention is well-known anion, nonion and cation surfactants. The surfactant is, for example, described in "Surfactant Handbook" which was edited by NISHI Ichiro, IMAI Tooziro and KASAI Masai and was issued by Sanqyo Tosyo Co, Ltd. on 1960. The addition amount of the surfactant is preferable 0.1 to 30 mg/m$^2$, more preferable 0.2 to 10 mg/m$^2$. When the addition amount is 0.1 mg/m$^2$ or more, occurrence of cissing tends to be inhibited. When the addition amount is 30 mg/m$^2$ or less, then the surface to be coated tends to be better.

When the easy adhesive layer having a single layer constitution of the invention is needed to control flexibility, the easy adhesive layer contains particles, for example, particles primarily consisting tin dioxide, zirconia and titanium oxide. Also, the titanium chelate compounds described in JP-A-2005-97571 may be added into the easy adhesive layer.

The tin dioxide is preferably a tin dioxide (IV) having a composition of $SnO_2$. Specifically preferred is a tin dioxide doping stibium since tin dioxide has conductibility and surface resistance of the laminate film to be formed is lowered, and therefore, preventing dust from adhering. For such tin dioxide particles, usable are commercially available particles such as FS-10D, SN-38F, SN-100F, TDL-S and TDL-1 (all is stibium doped-tin dioxide particles manufactured by Ishihara Sangyo Kaisha Ltd.).

The zirconia has a composition of $ZrO_2$ and, for example, usable are NZS-20A and NZS-30A (either is manufactured by Nissan Chemical Industries, Ltd.)

The titanium oxide is preferably a titanium oxide (IV) having a composition of $TiO_2$. The titanium oxide may be a rutile type or an atanase type. Also, the surface thereof may be treated. For the titanium oxide, for example, usable are Idemitsu titania IT-S, IT-O and IT-W (all is manufactured by Idemitsu).

The antistatic additive usable in the easy adhesive layer having a single layer constitution of the invention includes an electronic conductive polymer such as polyaniline and polypyrrole, an ion conductive polymer having a carboxyl group or a surfonic acid group in the molecular chain and a conductive particle. Of those, the above-mentioned stibium doped-tin dioxide is specifically preferable from the viewpoints of conductivity and transparency. For the addition amount of the antistatic additive, it is preferably added so that surface resistance of the easy adhesive layer which is measured at 25° C., relative humidity of 30% is in the range of $1\times10^5$ to $1\times10^{13}$. When the surface resistance is $1\times10^5$ or more, the laminate film to be formed tends to avoid degradation of transparency depending on increase of the addition amount of the antistatic additive. When the surface resistance is $1\times10^{13}$ or less, disadvantages such as adhesion of dust does not tend to occur.

The thickness of the easy adhesive layer having a single layer constitution of the invention is preferably 10 to 500 nm, more preferably 30 to 150 nm. When the thickness thereof is 10 nm or more, then the easy adhesive layer tends to be better in its adhesiveness to the adjacent polyester substrate. When the thickness thereof is 500 nm or less, the surface of the easy adhesive layer tends to be better.

The method of coating of the easy adhesive layer having a single layer constitution of the invention is not specifically limited, usable are well-know methods such as bar-coator coating and slide-coator coating. For the coating solvent, usable is either of aqueous type and organic type solvents such as water, toluene, methanol, isopropyl alcohol, methyl ethyl ketone and a mixture thereof. Of those, the method using water as the coating solvent is preferable in view of easiness of the manufacture.

(2) Easy Adhesive Layer Having a Two Layers Constitution

Then, the adhesive layer having a two layers constitution is described. The layer closer to the substrate of the two layers constitution (first layer) is the same as the above-mentioned the easy adhesive layer having a single layer constitution. The second layer of the invention is coated on a position away from the polyester substrate than the first layer. The layer may contain a matting agent, a slipping agent, a surfactant, an antistatic addictive and particles for controlling flexibility in addition to a binder and a crosslinking agent, if necessary.

For the binder of the second layer of the invention, usable are an acrylic resin and a urethane resin. The polymer used as the binder is more preferably a polymer having a carboxyl group in the molecule. For the acrylic resin and urethane resin, usable are what are described in the easy adhesive layer having a single layer constitution.

When the binder of the second layer of the invention is used, the above polymer may be resolved in an organic solvent or may be used as aqueous dispersion. Since environment impact is small, the binder is preferably coated by aqueous type coating using aqueous dispersion. For the aqueous dispersion, usable are the above-mentioned commercially available polymers.

One or more different types of the polymer used as a binder of the second layer of the invention may be used herein either singly or as combined, if necessary.

The molecular weight of the polymer used as the binder of the easy adhesive layer having a single layer constitution of the invention is not specifically defined, generally, preferred is weight-average molecular weight of 3,000 to 1,000,000. When the weight-average molecular is 3,000 or more, then strength of the coating layer tends to be higher, and when the weight-average molecular weight is 1,000,000 or less, then the surface of the coating tends to be better.

The crosslinking agent applicable to the second layer of the invention is not specifically defined, preferred is a carbodiimide or epoxy crosslinking agent.

The carbodiimide crosslinking agent for use in the invention (hereinafter, sometimes referred to as carbodiimide compound) is not particularly limited herein as long as the compound is a compound having a carbodiimide group in the molecule. The carbodiimide compound is generally synthesized through condensation reaction. Herein, an organic group of an organic diisocyanate usable in the synthesis of the carbodiimide compound is not particularly limited, usable is either of an aromatic type, an aliphatic type and a mixture thereof, and preferred is an aliphatic type from the viewpoint of the reactivity. The carbodiimide crosslinking agent usable in the invention is available as a commercial available such as carbodiright V-02-L2 (manufactured by Nisshinbo Industries, Inc.).

The "epoxy crosslinking agent" is not particularly limited as long as it has a compound having two epoxy groups in the molecule. Examples of the epoxy crosslinking agent include Dinacol, EX614H, EX521, EX512, EX301, EX313, EX314, EX810, EX811.

The crosslinking agent of the invention is preferably added in the range of 1 to 100% by mass relative to the binder, more preferably 5 to 50% by mass. When the addition amount is 1% by mass or more, it tends to improve its adhesiveness to the adjacent layer. When the addition amount is 100% by mass or less, then the surface of the coating tends to be better.

The matting agent, surfactant, antistatic additive, particles for controlling flexibility usable in the second layer of the invention are the same as those of the above-mentioned easy adhesive layer having a single layer constitution.

The thickness of the second layer of the invention is not particularly limited, preferably 10 to 5,000 nm, more preferably 20 to 1500 nm. When the thickness thereof is 10 nm or more, it tends to improve its adhesiveness to the adjacent layer. When the thickness thereof is 5,000 nm or less, the surface thereof tends to be better.

The coating method of the second layer is not particularly limited, usable are well-know methods such as bar-coator coating and slide-coator. The second layer of the invention may be coated by the same methods as or different methods from that for the easy adhesive layer having a single layer constitution. Furthermore, the second layer of the invention may be coated to dry at the same time with the easy adhesive layer having a single layer constitution or be coated after the easy adhesive layer having a single layer constitution is coated to dry.

For the coating solvent for coating the second layer of the invention, usable is either of aqueous type and organic type solvents such as water, toluene, methanol, isopropyl alcohol, methyl ethyl ketone and a mixture thereof. The coating solvent may be the same as or different from that of the first layer. The solvent of the second layer of the invention is also preferably water from the viewpoints of the easiness of manufacturing and the cost thereof.

(Organic Layer)

The organic layer contains a resin which is obtained by curing an acrylic monomer having at least two (meth) acryloyl groups and at least two urethane groups in the molecule (hereinafter, referred to as the acrylic monomer of the invention) as a polymerizable component. Examples of the acrylic monomer of the invention include a monomer having a structure represented by the following Formula (1).

In the Formula (1), Acr is an acryloyl group or a methacryloyl group, n is an integer of 1 to 5, $L^1$ is a bivalent linking group and $L^2$ is a linking group having valence of (n+1).

Examples of $L^1$ include a liner alkylene group, an alicyclic alkylene group, an arylene group and an aralkylene group. Specific examples of $L^1$ are shown below, to which, however, $L^1$ for use in the invention should not be limited.

Examples of $L^2$ include a liner alkylene group or a trivalent to hexatomic group obtained by removing voluntary 1 to 4 of hydrogen atom from the liner alkylene group. Specific examples of $L^2$ are shown below, to which, however, $L^2$ for use in the invention should not be limited.

Of the monomer represented by the Formula (1), preferred is an acrylic monomer having from two to six functional groups.

Specific examples of the acrylic monomer for use in the invention are shown below, to which, however, the acrylic monomer for use in the invention should not be limited. $L^2$s may be the same or differ to each other in the Formula (1).

The acrylic monomer of the invention preferably has a molecular weight of 100 to 5000, more preferably 200 to 2000, furthermore preferably 300 to 1000. One or more different types of the acrylic monomer of the invention may be used singly or as combined.

In the organic layer of the barrier firm of the invention, a resin which is obtained by polymerizing only the acrylic monomer of the invention may be used, however, preferably a resin which is obtained by copolymerizing the acrylic monomer of the invention with a monomer other than that. Examples of a monomer copolymerizable with the acrylic monomer of the invention includes an acrylic monomer other than the acrylic monomer of the invention, styrene monomer, vinylester polymer, acrylamide monomer, maleic acid monomer. The monomer copolymerizable with the acrylic monomer of the invention is preferably a monofunctional monomer, more preferably a monofunctional acrylic monomer and a monofunctional methacrylic monomer. The molecular weight for the monofunctional acrylic monomer and the monofunctional methacrylic monomer is not specifically limited, generally, 150 to 600. One or more different monomers copolymerizing may be used singly or as combined. Specific examples of the monofunctional monomer is shown below, to which, however, the monofunctional monomer for use in the invention should not be limited.

-continued

The molar ratio of the acrylic monomer of the invention to the monomer other than that of the invention is not specifically limited. The molar ratio is preferably 0 to 20 mole of the monomer other than the monomer of the invention relative to one mole of the acrylic monomer of the invention, more preferably 0 to 10 mole, furthermore preferably 0 to 5 mole.

A monomer mixture of the acrylic monomer of the invention and the monomer other than the monomer of the invention may contain a phosphoric acid system (meth)acrylate monomer or a (meth)acrylate monomer having a silancoupling group for the viewpoints of improvement of adhesiveness.

Examples of the phosphoric acid system (meth)acrylate monomer or the (meth)acrylate monomer having a silancoupling group are shown below, to which, the invention is not limited.

For forming the organic layer, usable are ordinary solution coating method and vacuum film formation method. The solution coating method includes, for example, a dip coating method, an air knife coating method, a curtain coating method, a roller coating method, a wire bar coating method, a gravure coating method, a slide coating method, and an extrusion coating method of using a hopper as in U.S. Pat. No. 2,681,294. Not specifically defined, the vacuum film formation method is preferably a flash vacuum evaporation method as in U.S. Pat. Nos. 4,842,893, 4,954,371, 5,032,461.

The monomer polymerization method is not specifically defined, for which, for example, preferred is thermal polymerization, light (UV, visible ray) polymerization, electronic beam polymerization, plasma polymerization or their combination. Of those, especially preferred is photopolymerization. In photopolymerization, a photopolymerization initiator may be used. Examples of the photopolymerization initiator are Irgacure series (e.g., Irgacure 651, Irgacure 754, Irgacure 184, Irgacure 2959, Irgacure 907, Irgacure 369, Irgacure 379, Irgacure 819) sold by Ciba Specialty Chemicals; Darocure series (e.g., Darocure TPO, Darocure 1173); Quantacure PDO; Esacure series (e.g., Esacure TZM, Esacure TZT) and oligomer-type Esacure KIP series sold by Sartomer.

The light for irradiation is generally UV light from high-pressure mercy lamp or low-pressure mercy lamp. The irradiation energy is preferably at least 0.5 J/cm$^2$, more preferably at least 2 J/cm$^2$. In case where the oxygen concentration in polymerization is lowered by a nitrogen substitution method, the oxygen concentration is preferably at most 2%, more preferably at most 0.5%. In case where the oxygen partial pressure in polymerization is lowered by a pressure reduction method, the total pressure is preferably at most 1000 Pa, more preferably at most 100 Pa. Especially preferred is UV polymerization with energy irradiation of at least 2 J/cm$^2$ under a reduced pressure condition of at most 100 Pa. The polymerization of the monomer is preferably carried out after the monomer mixture is provided on the plastic film, for example, by coating.

The center liner average roughness of the organic layer on the side of the inorganic layer is preferably 0.5 nm or less, more preferably 0.4 nm or less, even more preferably 0.3 nm or less.

The thickness of the organic layer is not specifically defined. However, when too thin, the layer could not be uniform; but when too thick, the layer may be cracked and its barrier capability may lower. From these viewpoints, the thickness of the organic layer is preferably from 50 nm to 5000 nm, more preferably from 200 nm to 2000 nm.

Since the barrier film of the invention has a structure in which the organic layer containing a resin obtained by curing an acrylic monomer having urethane groups as a polymerizable component is laminated on the easy adhesive layer, the adhesiveness of the organic layer to the easy adhesive layer is improved and the organic layer is not easily peeled even if the barrier film is folded. Accordingly, the barrier film of the invention has the high vapor barrier property and can maintain such the high barrier property even if the barrier film is folded.

(Inorganic Layer)

The inorganic layer is, in general, a layer of a thin film comprising a metal compound. For forming the inorganic layer, usable is any method capable of producing the intended thin film. For it, for example, suitable are physical vapor deposition methods (PVD) such as a vapor evaporation method, a sputtering method, an ion plating method; various chemical vapor deposition methods (CVD); liquid phase growth methods such as a plating or sol-gel method. Of those, preferred are physical vapor deposition methods (PVD) and chemical vapor deposition methods (CVD), which may evade thermal influences on the substrate film in inorganic layer formation, and which may readily produce uniform thin film layers at rapid production speed. Not specifically defined, the component to be in the inorganic layer may be any one satisfies the above-mentioned requirements. For example, it includes oxides, nitrides or oxinitrides containing at least one metal selected from Si, Al, In, Sn, Zn, Ti, Cu, Ce and Ta. Of those, preferred are oxides, nitrides or oxinitrides of a metal selected from Si, Al, In, Sn, Zn and Ti; more preferred are metal oxides, nitrides or oxinitrides with Si or Al. These may contain any other element as a subsidiary component.

In the invention, the inorganic layer is formed on the organic layer which has a smooth surface and, therefore, the inorganic layer to be formed has a surface of which smoothness is high. The smoothness of the inorganic layer to be formed in the invention is preferably 0.5 nm or less at terms of the mean roughness (Ra value) in 10 μm square, more preferably 0.3 nm or less, even more preferably 0.1 nm or less.

Not specifically defined, the thickness of the inorganic layer is preferably within the range of from 10 to 300 nm per layer, more preferably 10 to 200 nm, even more preferably 20 to 100 nm and furthermore preferably 30 to 70 nm.

Two or more of the inorganic layers may be laminated. In this case, for each layer, one or different types compositions are used singly or as combined. When the two or more layers are laminated, it is desirable that each inorganic layer is designed in the above preferable range.

(Laminating of the Organic Layer and the Inorganic Layer)

The barrier film may have any layer on the inorganic layer as long as the barrier film has a structure in which the easy adhesive layer, the organic layer and the inorganic layer are laminated in that order. Preferable examples of the structure include a structure in which organic layers and inorganic layers are alternately on the inorganic layer. The outermost layer may be an inorganic layer or an organic layer.

The organic layer and the inorganic layer may be laminated by repeated film formation to form the organic layer and the inorganic layer in a desired layer constitution. In case where the inorganic layer is formed according to a vacuum film formation method such as sputtering method, vacuum evaporation method, ion plating method or plasma CVD method, then it is desirable that the organic layer is also formed according to a vacuum film formation method such as the above-mentioned flash vapor deposition method. While the barrier layer is formed, it is especially desirable that the organic layer and the inorganic layer are laminated all the time in a vacuum of at most 1000 Pa, not restoring the pressure to an atmospheric pressure during the film formation. More preferably, the pressure is at most 100 Pa, even more preferably at most 50 Pa, still more preferably at most 20 Pa.

The barrier film of the invention is favorably used for a substrate and a sealing film of various devices. For example, the barrier film may be used for a substrate or a sealing film of organic EL devices and solar cells. Herein, the barrier film preferably seals the device so that the easy adhesive layer side is closer to the device. The barrier film may be provided on the both side or one side of the device. Examples of the display device in the invention include circular polarizing plates, liquid-crystal display devices, touch panels and organic EL devices. For solar cell devices for use in the invention, what are generally used for solar cell devices is used. Examples include single crystal silicon solar cell devices, polycrystalline silicon solar cell devices, amorphous silicon solar cell devices which are constructed in a single junction type or a tandem structure type, III-V compound semiconductor solar cell devices such as a gallium arsenide (GaAs) semiconductor solar cell device and an indium phosphorus (InP) semiconductor solar cell device, II-VI compound semiconductor solar cell devices such as a cadmium tellurium (CdTe) semiconductor solar cell device, I-III-VI compound semiconductor solar cell device such as a copper/indium/selenium (CIS) semiconductor solar cell device, a copper/indium/gallium/selenium (CIGS) semiconductor solar cell device and a copper/indium/gallium/selenium/sulfur (CIGSS) semiconductor solar cell device, dye sensitizing solar cell devices and organic solar cell devices. Of those, the solar cell device of the invention is I-III-VI compound semiconductor solar cell devices such as a copper/indium/selenium (CIS) semiconductor solar cell device, a copper/indium/gallium/selenium (CIGS) semiconductor solar cell device and a copper/indium/gallium/selenium/sulfur (CIGSS) semiconductor solar cell device.

[Organic EL Device]

The barrier film of the invention can be preferably used as an organic EL devise. Here, an organic EL device using a barrier film of the invention (hereinafter referred to as organic EL devise of the invention).

The organic EL device of the invention has a cathode and an anode on a substrate and has an organic compound layer containing an organic light emitting layer (hereinafter sometimes simply referred to as "light emitting layer") between both of the electrodes. In view of the property of the light emitting device, at least one of the anode and the cathode is preferably transparent.

As the form of the lamination of the organic compound layer in the invention, it is preferred such a form that a hole transporting layer, a light emitting layer, and an electron transporting layer are laminated in this order from the side of the anode. Further, a charge blocking layer or the like may be present between the hole transporting layer and the light emitting layer or between the light emitting layer and the electron transporting layer. A hole injecting layer may be provided between the anode and the hole transporting layer and an electron injecting layer may be present between the cathode and the electron transporting layer. Each of the layers may be divided into a plurality of secondary layers.

(Anode)

It may usually suffice that the anode has a function as an electrode for supplying holes to the organic compound layer and the shape, structure, size, etc. thereof are not particularly limited and can be selected properly from known electrode materials in accordance with the application use and the purpose of the light emitting device. As described above, the anode is formed usually as a transparent anode.

The material for the anode includes preferably, for example, metals, alloys, metal oxides, conductive compounds or mixtures of them. Specific examples of the anode material include conductive metal oxides such as tin oxide doped with antimony, fluorine, etc. (ATO, FTO), tin oxide, zinc oxide, indium oxide, indium tin oxide (ITO), and indium zinc oxide (IZO), metals such as gold, silver, chromium, and nickel, as well as mixtures or laminates of such metals with conductive metal oxides, inorganic conductive materials such as copper iodide, and copper sulfide, organic conductive materials such as polyaniline, polythiophene and polypyrrole, and laminates thereof with ITO. Among them, preferred are conductive metal oxides, and ITO is particularly preferred with a view point of productivity, high conductivity, transparency, etc.

The anode can be formed on the substrate in accordance with a method selected properly, for example, from wet method such as a printing method and a coating method, physical method such as a vacuum vapor deposition method, a sputtering method, and an ion plating method, and chemical method such as CVD or plasma CVD while considering the adaptability with the material constituting the anode. For example, in a case of selecting ITO as the material for the anode, the anode can be formed in accordance with a DC or REF sputtering method, a vacuum deposition method, an ion plating method, etc.

In the organic EL device of the invention, the position for forming the anode is not particularly limited and can be selected properly in accordance with the application use and the purpose of the light emitting device and it is preferably formed on the substrate. In this case, the anode may be formed entirely or partially on one of the surfaces of the substrate.

Patterning upon forming the anode may be conducted by chemical etching adopting photolithography, etc., or by physical etching adopting laser, etc. Further, the patterning may be conducted by vapor deposition, sputtering, etc. while stacking a mask, or by a liftoff method or a printing method.

The thickness of the anode can be selected properly depending on the material constituting the anode and, while it can not be determined generally, it is usually about from 10 nm to 50 μm and, preferably, from 50 nm to 20 μm.

The resistance value of the anode is, preferably, $10^3 \Omega/\square$ or less and, more preferably, $10^2 \Omega/\square$ or less. In a case where the anode is transparent, it may be colorless transparent or colored transparent. For taking out light emission from the side of the transparent anode, the transmittance is, preferably, 60% or higher and, more preferably, 70% or higher.

The transparent anode is described specifically in "New Development of Transparent Electrode Film", supervised by Yutaka Sawada, published from CMC (1999) and the matters described therein can be applied to the invention. In a case of using a plastic substrate of low heat resistance, a transparent anode using ITO or IZO and formed as a film at a low temperature of 150° C. or lower is preferred.

(Cathode)

It may usually suffice that the cathode has a function as an electrode for injecting electrons to the organic compound layer, and the shape, structure, size, etc. thereof are not particularly limited and can be selected properly from known electrode materials in accordance with the application use and the purpose of the light emitting device.

The material constituting the cathode includes, for example, metals, alloys, metal oxides, electroconductive compounds, and mixtures thereof. Specific examples include alkali metals (for example, Li, Na, K, and Cs), alkali earth metals (for example, Mg and Ca), gold, silver, lead, aluminum, sodium-potassium alloy, lithium-aluminum alloy, magnesium-silver alloy, indium, and rare earth metals such as ytterbium. They may be used alone or two or more of them can be preferably used in combination with a view point of making the stability and the electron injecting property compatible.

Among them, as the material constituting the cathode, alkali metals or alkali earth metals are preferred in view of the electron injecting property and materials mainly comprising aluminum are preferred with a view point of excellent storage stability.

Materials mainly comprising aluminum mean aluminum per se, alloys of aluminum and from 0.01 to 10 mass % of alkali metals or alkali earth metals, or mixtures thereof (for example, lithium-aluminum alloy, and magnesium-aluminum alloy).

The materials for the cathode are described specifically in JP-A-2-15595 and JP-A-5-121172 and the materials described in the publications can be applied also to the invention.

The method of forming the cathode is not particularly limited and it can be conducted in accordance with known methods. For example, the cathode can be formed in accordance with a method selected properly from wetting methods such as a printing method and a coating method, physical methods such as a vacuum vapor deposition method, a sputtering method or, an ion plating method, and chemical methods such as a CVD or plasma CVD method while considering the adaptability with the material constituting the cathode. For example, in a case of selecting metals or the like as a material for the cathode, it can be formed in accordance with a sputtering method, etc. by sputtering one of them or plurality of them simultaneously or successively.

Patterning upon forming the cathode may be conducted by chemical etching such as photolithography, or physical etching such as by laser, or it may be conducted by vacuum vapor deposition or sputtering while stacking a mask or by a lift off method or a printing method.

In the invention, the position for forming the cathode is not particularly limited and it may be formed entirely or partially on the organic compound layer.

Further, a dielectric layer of a fluoride or oxide of an alkali metal or alkali earth metal may be inserted at a thickness of from 0.1 to 5 nm between the cathode and the organic compound layer. The dielectric layer can be regarded as a sort of an electron injecting layer. The dielectric layer can be formed, for example, by a vacuum vapor deposition method, a sputtering method or an ion plating method.

The thickness of the cathode can be selected properly depending on the material constituting the cathode and, while it can not be defined generally, it is usually about from 10 nm to 5 μm and, preferably, from 50 nm to 1 μm.

The cathode may be transparent or not transparent. The transparent cathode can be formed by forming a thin film of the material of the cathode to a thickness of from 1 to 10 nm and, further, laminating a transparent conductive material such as ITO or IZO.

(Organic Compound Layer)

The organic compound layer in the invention is to be described.

The organic EL device of the invention has at least one organic compound layer containing at least a light emitting layer. Other organic compound layers than the organic light emitting layer include layers such as a hole transporting layer, an electron transporting layer, a charge blocking layer, a hole injecting layer, and an electron injecting layer respectively as described above.

In the organic EL device of the invention, each of the layers constituting the organic compound layer can be formed suitably by any of dry film forming methods such as a vapor deposition method or a sputtering method, a transfer method, a printing method, etc.

(1) Organic Light Emitting Layer

The organic light emitting layer is a layer having a function of accepting holes from the anode, the hole injecting layer, or the hole transporting layer and accepting electrons from the cathode, the electron injecting layer, or the electron transporting layer upon application of an electric field, and providing a site for re-combination of hole and electron to emit light.

The light emitting layer in the invention may be formed only of a light emitting material, or may be formed of a mixture of a host material and light emitting material. The light emitting material may be a fluorescent material or a phosphorescent material, and the dopant may be of one or plural kinds. The host material is, preferably, a change transporting material. The host material may be of one kind or plural kinds and includes, for example, a mixture of an electron transporting host material and a hole transporting host material. Further, it may also contain a material not having charge transportability and not emitting light in the light emitting layer.

Further, the light emitting layer may have one or more layers and each of the layers may emit light at different emission colors.

Examples of the fluorescent material usable in the invention include, for example, various metal complexes typically represented by metal complexes of benzoxazole derivatives, imidazole derivatives, benzothiazole derivatives, styrylbenzene derivatives, polyphenyl derivatives, diphenyl butadiene derivatives, tetraphenyl butadiene derivatives, naphthalimide derivatives, coumarine derivatives, condensed aromatic compound, perynone derivatives, oxadiazole derivatives, oxazine derivatives, aldazine derivatives, pyralidine derivatives, cyclopentadiene derivatives, bisstyryl anthracene derivatives, quinacridone derivatives, pyrrolopyridine derivatives, thiadiazolopyridine derivatives, cyclopentadiene derivatives, styrylamine derivatives, diketopyrrolopyrole derivatives, aromatic dimethylidene compound, and 8-quinolinole derivatives, and metal complexes of pyrrometene derivatives, polymer compounds such as polythiophene, polyphenylene and compounds such as polyphenylene vinylene, and organic silane derivatives.

Further, the phosphorescent materials usable in the invention includes, for example, complexes containing transition metal atoms or lanthanoide atoms.

The transition metal atoms are not particularly limited and include, preferably, ruthenium, rhodium, palladium, tungsten, rhenium, osmium, iridium, and platinum and, more preferably, rhenium, iridium and platinum.

The lanthanoide atoms include lanthanum, cerium, praseodymium, neodymium, samarium, europium, gadolinium, terbium, dysprosium, holmium, erbium, thulium, ytterbium, and lutetium. Among the lanthanoide atoms, neodymium, europium, and gadolinium are preferred.

Ligands of complexes include those ligands, described, for example, in "Comprehensive Coordination Chemistry", written by C. Wilkinson, et al., published from Pergamon Press in 1987, "Photochemistry and Photophysics of Coordination Compounds" written by H. Yersin, published from Springer-Verlag Co. in 1987, and "Organic Metal Chemistry—Foundation and Application-" written by Akio Yamamoto, published from Shokabo Co. in 1982, etc.

Specific ligands are, preferably, halogen ligands (preferably, chlorine ligand), nitrogen-containing heterocyclic ligands (for example, phenylpyridine, benzoquinoline, quinolinol, bipyridyl, and phenanthroline), diketone ligands (for example, acetylacetone), carboxylic acid ligands (for example, acetic acid ligand), carbon monoxide ligand, isonitrile ligand, and cyano ligand and, more preferably, nitrogen-containing heterocyclic ligands. The complexes described above may have one transition metal atom in the compound or may be a so-called composite nuclei complexes having two or more of them. Metal atoms of different kinds may be contained together.

The phosphorescent material is contained in the light emitting layer by, preferably, from 0.1 to 40 mass % and, more preferably, from 0.5 to 20 mass %.

Further, the host materials contained in the light emitting layer in the invention include, for example, those having carbazole skeleton, having diarylamine skeleton, having pyridine skeleton, having pyrazine skeleton, having triazine skeleton, and having arylsilane skeleton, or those materials exemplified in the columns for the hole injecting layer, the hole transporting layer, the electron injecting layer and the electron transporting layer to be described later.

The thickness of the light emitting layer is not particularly limited and usually it is, preferably, from 1 nm to 500 nm, more preferably, from 5 nm to 200 nm and, further preferably, from 10 nm to 100 nm.

(2) Hole Injecting Layer, Hole Transporting Layer

The hole injecting layer and the hole transporting layer are layers having a function of accepting holes from the anode or from the side of the anode and transporting them to the cathode. The hole injecting layer and the hole transporting layer are preferably layers containing specifically, for example, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stylbene derivatives, silazene derivatives, aromatic tertiary amine compounds, styrylamine compounds, aromatic dimethylidine compounds, porphiline compounds, organic silane derivatives, and carbon.

The thickness of the hole injecting layer and the hole transporting layer is preferably each 500 nm or less with a view point of lowering the driving voltage.

The thickness of the hole transporting layer is, preferably, from 1 nm to 500 nm, more preferably, from 5 nm to 200 nm and, further preferably, from 10 nm to 100 nm. Further, the thickness of the hole injecting layer is, preferably, from 0.1 nm to 200 nm, more preferably, from 0.5 nm to 100 nm and, further preferably, from 1 nm to 100 nm.

The hole injecting layer and the hole transporting layer may be of a single layered structure comprising one or more of the materials described above or may be of a multi-layered structure comprising plural layers of an identical composition or different kinds of compositions.

(3) Electron Injecting Layer, Electron Transporting Layer

The electron injecting layer and the electron transporting layer are layers having a function of accepting electron from the cathode or from the side of the cathode and transporting them to the side of the anode. The electron injecting layer and the electron transporting layer are preferably layers containing, specifically, various kinds of metal complexes typically represented by metal complexes of triazole derivatives, oxazole derivatives, oxodiazole derivatives, imidazole derivatives, fluorenone derivatives, anthraquinodimethane derivatives, anthron derivatives, diphenylquinone derivatives, thiopyrane dioxide derivatives, carbodiimide derivatives, fluorenylidene methane derivatives, distyrylpyradine derivatives, aromatic ring tetracarboxylic acid anhydrides such as naphthalene and perylene, phthalocyanine derivatives, and 8-quinolinole derivatives, and metal complex having metal phthalocyanine, benzoxazole, or benzothiazole as the ligand, organic silane derivatives, etc.

The thickness of the electron injecting layer and the electron transporting layer is preferably from 50 nm or less respectively with a view point of lowering the driving voltage.

The thickness of the electron transporting layer is, preferably, from 1 nm to 500 nm, more preferably, from 5 nm to 200 nm and, further preferably, from 10 nm to 100 nm. Further, the thickness of the electron injecting layer is, preferably, from 0.1 nm to 200 nm, more preferably, from 0.2 nm to 100 nm and, further preferably, from 0.5 nm to 50 nm.

The electron injecting layer and the electron transporting layer may be of a single layered structure comprising one or more of the materials described above or a multi-layered structure comprising plural layers each of an identical composition or different kinds of compositions.

(4) Hole Blocking Layer

The hole blocking layer is a layer having a function of preventing holes transported from the anode to the light emitting layer from passing through to the side of the cathode. In the invention, the hole blocking layer can be provided as an organic compound layer adjacent with the light emitting layer on the side of the cathode. The electron transporting layer or the electron injecting layer may also have a function of the hole blocking layer.

Examples of the organic compound constituting the hole blocking layer include aluminum complexes such as $BAl_q$, triazole derivatives, and phenanthroline derivatives such as BCP.

The thickness of the hole blocking layer is, preferably, from 1 nm to 500 nm, more preferably, 5 nm to 200 nm and, further preferably, from 10 nm to 100 nm.

The hole blocking layer may be of a single layered structure comprising one or more kinds of the materials described above or a multi-layered structure comprising plural layers each of an identical composition or different kinds of compositions.

(Protective Layer)

In the invention, the entire organic EL device may be protected by a protective layer.

The material contained in the protective layer may be any material of suppressing intrusion of moisture or oxygen into the device that promotes deterioration of the device.

Specific examples include metals such as In, Sn, Pb, Au, Cu, Ag, Al, Ti, and Ni, metal oxides such as MgO, SiO, $SiO_2$, $Al_2O_3$, GeO, NiO, CaO, BaO, $Fe_2O_3$, $Y_2O_3$, and $TiO_2$, metal nitrides such as $SiN_x$, metal oxynitrides such as $SiN_xO_y$, metal carbides such as $SiC_w$ and $SiO_zC_w$, metal fluorides such as $MgF_2$, LiF, $AlF_3$, and $CaF_2$, polyethylene, polypropylene, polymethyl methacrylate, polyimide, polyurea, polytetrafluoroethylene, polychlorotrifluoroethylene, polydichlorodifluoroethylene, copolymer of chlorotrifluoroethylene and dichlorofluouroethylene, a copolymer obtained by copolymerizing tetrafluoroethylene and a monomer mixture containing at least one comonomer, a fluoro-containing copolymer having a cyclic structures in the copolymerization main chain, water absorbing material with a water absorptivity of 1% or more, and a moisture proofing material with a water absorptivity of 0.1% or less. Among them, metal oxides, metal nitride, or metal oxynitride are preferred and silicon oxides, silicon nitride, or silicon oxynitride are particularly preferred.

The method of forming the protective layer is not particularly limited and, for example, a vacuum vapor deposition method, a sputtering method, a reactive sputtering method, an MBE (Molecular Beam Epitaxy) method, a cluster ion beam method, anion plating method, a plasma polymerization method (RF-excited ion plating method), a plasma CVD method, a laser CVD method, a thermal CVD method, a gas source CVD method, a coating method, a printing method, or a transfer method can be applied. The protective layer in this invention may be used as a conductive layer.

(Sealing)

Further, the organic EL device of the invention may be sealed for the entire device by using a sealing vessel.

Further, a water absorbent or an inert liquid may be sealed in a space between the sealing vessel and the light emitting device. The water absorbent is not particularly limited and includes, for example, barium oxide, sodium oxide, potassium oxide, calcium oxide, sodium sulfate, calcium sulfate, magnesium sulfate, phosphorous pentoxide, calcium chloride, magnesium chloride, copper chloride, cesium fluoride, niobium fluoride, calcium bromide, vanadium bromide, molecular sieve, zeolite, and magnesium oxide. The inert liquid is not particularly limited and includes, for example, paraffins, liquid paraffins, fluoro-solvents such as perfluoro alkanes or perfluoro amines and perfluoro ethers, chloro-solvents, and silicone oils.

A solid sealing method may be used as another sealing method. The solid sealing method is that, after the protective layer is formed on an organic EL device, an adhesive layer and a barrier type support layer are laminated thereon and then hardened. The materials of the adhesives are not particularly limited and, for example, a thermosetting epoxy resin and a photopolymer acrylate resin may be used. The barrier type support layer may be a grass or a barrier film of the invention.

For still another sealing method, a layer sealing method may be used. The layer sealing method is that alternate laminate layers of inorganic layer and organic layer are formed on an organic EL device. The organic layer may be laminated by a protective layer before the alternate laminate layer is formed.

Light emission can be obtained from the organic EL device of the invention by applying a DC (may optionally containing AC component) voltage (usually from 2 to 15 V), or a DC current between the anode and the cathode.

For the driving method of the organic EL device of the invention, a driving method described in JP-A-2-148687, JP-A-6-301355, JP-A-5-29080, JP-A-7-134558, JP-A-8-234685, JP-A-8-241047, Japanese Patent 2784615, U.S. Pat. No. 5,828,429 and U.S. Pat. No. 6,023,308 can be applied.

<Solar Cell>

Then, a solar cell is described. The solar cell is preferably obtained by forming a photoelectric transfer layer which is a semiconductor layer comprising of a Ib element, a IIIb element and a VIb element (I-III-VI semiconductor) on a dried substrate for use in a solar cell. Further, a solar cell module is obtained by sticking the barrier film to the solar cell. The photoelectric transfer layer is preferably a semiconductor layer comprising at least one element selected from the group consisting of copper (Cu), silver (Ag), gallium (Ga), indium (In), surfer (S), selenium (Se) and tellurium (Te). The photoelectric transfer layer is preferably a CIGS semiconductor using a selenide method, a sulfoselenide method or three steps method, and however, may be a semiconductor comprising a Ivb element such as Si (VI semiconductor), a semiconductor comprising a combination of a IIIb element and a Vb element such as GaAs (III-V semiconductor), a semiconductor comprising a IIb element and a VIb element such as CdTe (II-VI semiconductor) and a semiconductor comprising a combination thereof. In the specification, description of element is based on the short period type periodic table.

When the semiconductor comprising Si is employed, the photoelectric transfer layer is an amorphous silicon thin film layer, a micro crystallite silicon thin film layer, a thin film which contains germanium therein, and a layer having a tandem construction comprising two or more layers thereof. The film may be formed by a plasma CVD method.

An example of CIGS type photoelectric transfer layer is shown below.

The thin film solar cell in which, as a light absorbing layer, a $Cu/In/Se_2$ semiconductor thin film of chalcopyrite structure comprising a Ib element, a IIb element and a VIb element (CIS thin film) or a $Cu/(In, Ga)/Se_2$ semiconductor thin film in which Ga is solid-solved therein (CIGS thin film) is used, has advantage of having a high energy conversion efficiency and being less deterioration of the efficiency depending on light irradiation.

Figure 1:
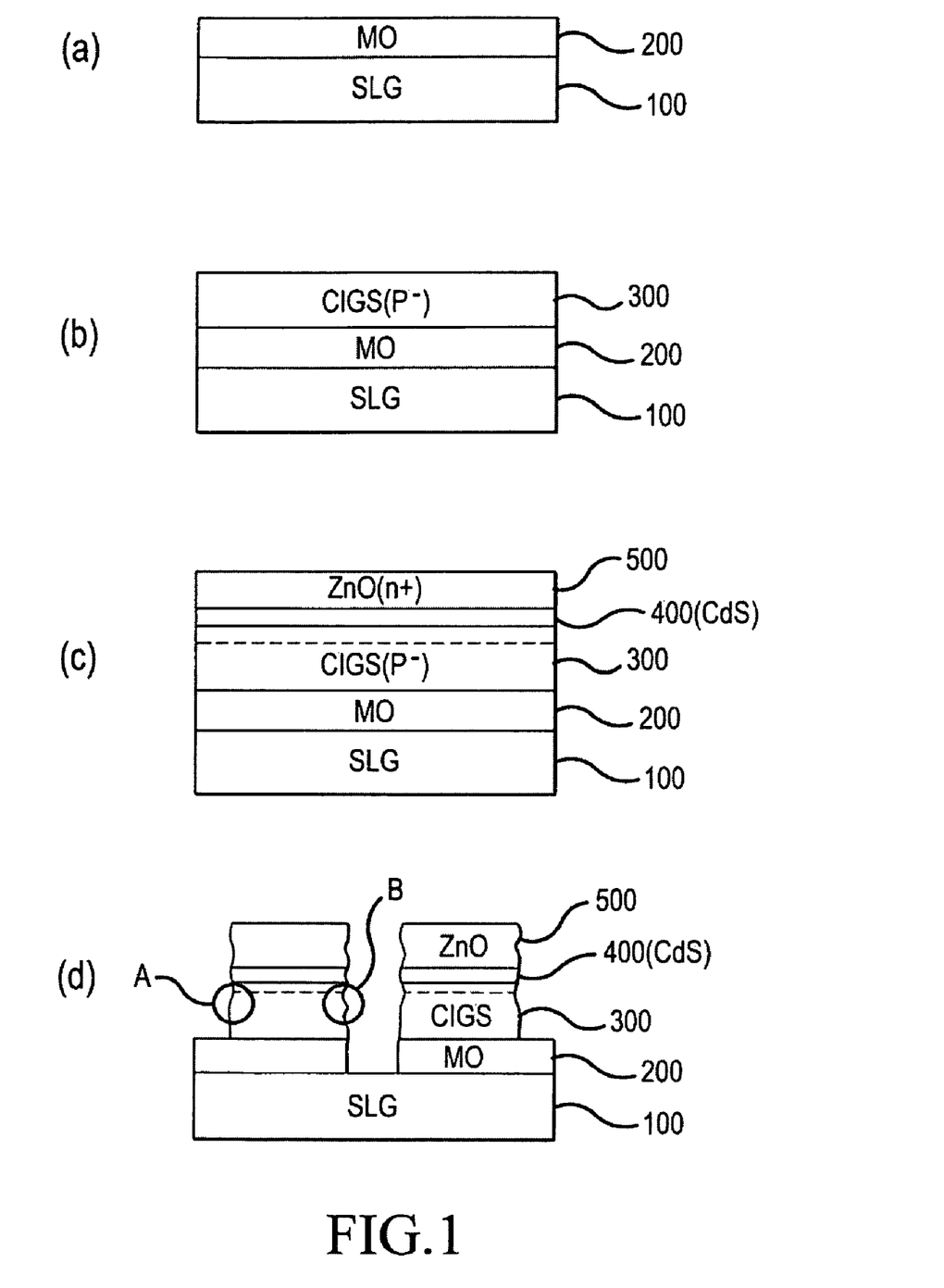
FIG. 1 shows a cross-section drawing of a general device of a cell of a CIGS solar cell.

FIG. 1 (a) to (d) are cross-section drawings of a device for describing a general manufacturing method of a cell of CIGS thin film solar cell.

As shown in FIG. 1(a), first, Mo electrode layer 200 to be a lower electrode is formed on a substrate 100. Second, as shown in Fig. (b), on the Mo electrode layer 200, a light absorbing layer 300 comprising CIGS thin film which shows p$^-$ type by controlling the composition. Then, as shown in FIG. 1 (c), a buffer layer 400 such as CdS is formed on the light absorbing layer 300 and then a light transmitting electrode layer 500 comprising ZnO, which shows n$^+$ type by doping impurity, and is to be an upper electrode on the minus side, is formed on the buffer layer 400. Then, as shown in Fig. (d), scribe processing of from the light transmitting electrode layer 500 comprising ZnO to the Mo electrode layer 200 is collectively carried out with a mechanical scribe apparatus. Thereby, each cell of the thin film solar cell is electrically separated, that is, each cell is individuated. Substances which suitably form a film by the manufacturing apparatus of the embodiment are shown below.

(1) Substance containing an element, a compound or an alloy which serves as a liquid phase at normal temperature or serves as a liquid phase by heating.
(2) Chalcogen compound (a compound containing S, Se or Te)
II-VI compounds: ZnS, ZnSe, ZnTe, CdS, CdSe, CdTe, etc.
I-III-VI$_2$ compounds: CuInSe$_2$, CuGaSe$_2$, Cu (In, Ga) Se$_2$, CuInS$_2$, CuGaSe$_2$, Cu(In, Ga) (S, Se)$_2$, etc.
I-III$_3$-VI$_5$ compounds: CuIn$_3$Se$_5$, CuGa$_3$Se$_5$, Cu(In, Ga)$_3$Se$_5$, etc.
(3) Compounds having a chalcopyrite type structure and compounds having a defecting stannite type structure
I-III-VI$_2$ compound: CuInSe$_2$, CuGaSe$_2$, Cu(In, Ga)Se$_2$, CuInS$_2$, CuGaSe$_2$, Cu(In, Ga) (S, Se)$_2$, etc.
I-III$_3$-IV$_5$ compounds: CuIn$_3$Se$_5$, CuGa$_3$Se$_5$, Cu(In, Ga)$_3$Se$_5$, etc. Wherein, in the above description, (In, Ga) and (S, Se) represent (In$_{1-x}$Ga$_x$) and (S$_{1-y}$Se$_y$), in which x=0 or 1, y=0 or 1, respectively. (Constitution other than the photoelectric transfer layer)

For a n-type semiconductor forming junction with the I-III-VI compound semiconductor, for example, usable is a II-VI compound such as CdS, ZnO, ZnS and Zn (O, S, OH). Those compounds can form junction surface not having recombination of the photoelectric transfer layer with carrier. For example, refer to JP-A-2002-343987.

For a substrate, for example, usable are a glass plate such as sodium lime glass, a film such as a polyimide film and a metal plate such as a stainless steel plate, a titanium plate, an aluminium plate and a copper plate. In the invention, the above substrate for use in devices is specifically preferably film form or foil form. For a back side electrode, usable is a metal such as molybdenum, chromium and tungsten. Those metal materials are preferable because if those metal materials are heat-treated, those hardly mix with the other layer. In case of using a light electromotance layer comprising a I-III-VI compound semiconductor (light absorbing layer), the back side electrode preferably is Mo layer. For the back side electrode, a recombination center resides in the interface between the CIGS of the light absorbing layer and the back side electrode. Accordingly, when contact area of the back side electrode with the light absorbing layer is bigger than that required for electrical conduction, the power generation efficiency falls. In order to lessen the contact area, for example, the electrode layer preferably has a configuration in which an insulation material and metal were located in a line in the shape of a stripe (See JP-A-9-219530).

For material used for a transparent electrode, usable are well-known materials such as ITO, ZnO:Ga, ZnO:Al, ZnO:B, and SnO$_2$. The materials have a high light translucency, a low resistance and a high mobility of carrier, and therefore, these materials are preferable for the transparent electrode. For example, the materials may be referred to JP-11-284211.

Examples of the layer structure include a super straight type and a substraight type. In the case of using the light electromotance layer comprising a semiconductor layer (a light absorbing layer) consisting of I-III-VI compound semiconductor, the layer structure preferably is a substright type from the viewpoint of the conversion efficiency.

(Buffer Layer/Window Layer/Transparent Electrode)

For the buffer layer, usable are CdS, ZnS, ZnS (O, OH) and ZnMgO. For the window layer, usable are various transparent conducting materials such as ZnO and ITO. For example, if the Ga concentration in the CIGS is raised to make the band gap of the light absorbing layer large, the conducting band of the light absorbing layer is too much larger than that of ZnO, and therefore, the buffer layer is preferably ZnMgO, which has large energy in the conducting band. The buffer layer portion in the band structure of CIGS/the buffer layer/window layer (ZnO) is prevented from changing spike-like shape (convex), and therefore, the saturated current is prevented from decreasing; the layer portion is prevented from changing cliff-like shape (concave), and therefore, the open voltage and FF are prevented from decreasing; and the generating efficiency when the band gap is large is improved.

EXAMPLES

The characteristics of the invention are described more concretely with reference to the following Examples and Comparative Examples. In the following Examples, the material used, its amount and the ratio, the details of the treatment and the treatment process may be suitably modified or changed not overstepping the gist and the scope of the invention. Accordingly, the invention should not be limitatively interpreted by the Examples mentioned below.

1. Method and Evaluation of Barrier Film

Example 1

(1-1) Preparation of Substrate

As a substrate, a polyethylene naphthalate film (PEN film, Teijin DuPont's trade, name, Teonex Q65FA) was cut into 20 cm square pieces. Each layer was formed on a side of the surface.

(1-2) Formation of Easy Adhesive Layer

The substrate was subjected to corona discharge treatment at 730 J/m$^2$ and a first layer coating solution 1 consisting of the following composition was coated on the substrate according to bar coat method. The coating amount was 4.4 ml/m$^2$, and the coated layer was dried at 180° C. for one minute, thereby forming an easy adhesive layer having a thickness of 200 nm.

| <First Layer Coating Solution 1> | |
|---|---|
| Polyester resin binder (manufactured by DIC Corp., FineTex ES-650, solid content 29%) | 49.7 mass parts |
| Surfactant A (manufactured by Sanyo Chemical Industries, Ltd., Sanded BL, solid content 10%, anion) | 11.4 mass parts |
| Surfactant B (manufactured by Sanyo Chemical Industries, Ltd., Naroacty NH-100, solid content 5%, nonion) | 26.8 mass parts |
| Silica particle dispersion solution C (AEROSIL, OX-50, 20% of aqueous dispersion solution) | 2.4 mass parts |
| Colloidal silica dispersion solution D (Nissan Chemical Industries, Ltd., SNOWTEX XL, 20% of aqueous dispersion solution) | 4.6 mass parts |
| Carbodiimide compound (manufactured by Nisshinbo Industries, Inc., Carbodilight V-02-L2, solid content 10%, carbodiimide equivalent 385) | 28.2 mass parts |
| Distilled water | added so as to be the total of 1000 mass parts |

(1-3) Formation of Organic Layer

On the easy adhesive layer formed above, the coating solution consisting of the following composition was coated according to bar coat method. The coating amount is 5 ml/m$^2$, and the coated layer was cured therein through irradiation with UV light from a high-pressure mercury lamp (integrated radiation, about 2 J/cm$^2$) in a chamber having an oxygen concentration of 0.1% after nitrogen substitution, thereby forming an organic layer having a thickness of 500 nm±50 nm.

| <Coating Solution of Organic Layer> | |
|---|---|
| Bifunctional urethane acrylic monomer (manufactured by Daicel-cytec. Com., EBECRYL 4858) | 20 g |
| UV polymerization initiator (manufactured by Chiba Specialchem. Com., Irgacure 907) | 0.6 g |
| 2-butanone | 190 g |

<Measurement of Surface Roughness>

The surface roughness of the surface of the obtained organic layer was evaluated using an atom force microscope (AFM). Then, smoothness was expressed as an average roughness Ra (unit, nm) within a sample area of 1 μm square. Using SPI3800N/SPA400 (manufactured by SII NanoTechnology Inc.) as an apparatus and SI-DF20 as a cantilever, it was measured under handling frequency of 1 Hz and X and Y data number of 256 lines. The results were shown in Table 1.

(1-4) Formation of Inorganic Layer

Using a sputtering apparatus, an inorganic layer (aluminum oxide layer) was formed on the above organic layer. The target was aluminum, the discharge gas was argon and the reaction gas was oxygen. The pressure for forming was 0.1 Pa and the achievement film thickness was 40 nm. Then, the organic/inorganic laminate type barrier film was formed. The properties of the obtained barrier film (Smoothness and Water Vapor Permeability) were shown in Table 2.

Example 2

In (1-2) of Example 1, an easy adhesive layer having a two layer constitution was formed in place of the easy adhesive layer having a single layer constitution.

The first layer was formed in the same manner and the same prescription as Example 1. Then, on the surface, the following second layer coating solution was coated according to bar coat method. The coating amount was 4.4 ml/m$^2$, and the coated layer was dried at 170° C. for one minute. Then, the laminated film on which the first layer and the second layer were coated was obtained. According to the same process as that for Example 1, for which, however, (1-2) was altered, the barrier film having a structure of the PEN substrate/the easy adhesive layer (the first layer)/the easy adhesive layer (the second layer)/the organic layer/the inorganic layer as the barrier film of Example 2 was produced.

| <Second Layer Coating Solution> | |
|---|---|
| Acrylic resin binder (Latex of MMA$_{59}$-St$_9$-2EHA$_{26}$-HEMA$_5$-AA$_1$, concentration of solid content, 28%) | 62.7 mass parts |
| Silica particle dispersion solution C | 2.7 mass parts |
| Colloidal silica dispersion solution D | 4.6 mass parts |
| Surfactant A | 9.6 mass parts |
| Surfactant B | 26.8 mass parts |
| Carbodiimide compound (manufactured by Nisshinbo Industries, Inc., Carbodilight V-02-L2, solid content 10%, carbodiimide equivalent 385) | added so that the addition amount relative to the binder is the amount represented in Table 1. |
| Distilled water | added so as to be the total of 1000 mass parts |

Wherein MMA is methylmethacrylate, St is styrene, 2EHA is 2-ethylhexylacrylate, HEMA is hydroylmethacrylate and AA is acrylic acid. The figures represent ratio by weight.

Example 3

According to the same process as that for (1-2) of Example 1, for which, however, the first layer coating solution 1 was placed in the first layer coating solution 2 consisting of the following composition, the barrier film having a structure of the PEN substrate/the easy adhesive layer (the first layer)/the organic layer/the inorganic layer as the barrier film of Example 3 was produced.

| <First Layer Coating Solution 2> | |
|---|---|
| Acrylic resin binder (Latex of MMA$_{59}$-St$_9$-HEMA$_5$-AA$_1$, concentration of solid content, 28%) | 62.7 mass parts |
| Silica particle dispersion solution C | 2.7 mass parts |
| Colloidal silica dispersion solution D | 4.6 mass parts |
| Surfactant A | 9.6 mass parts |
| Surfactant B | 26.8 mass parts |
| Carbodiimide compound (manufactured by Nisshinbo Industries, Inc., Carbodilight V-02-L2, solid content 10%, carbodiimide equivalent 385) | added so that the addition amount relative to the binder is the amount represented in Table 1. |
| Distilled water | added so as to be the total of 1000 mass parts |

Wherein MMA is methylmethacrylate, St is styrene, 2EHA is 2-ethylhexylacrylate, HEMA is hydroylmethacrylate and AA is acrylic acid. The figures represent ratio by weight.

Comparative Example 1

Not forming an easy adhesive layer, an organic layer was formed on the substrate prepared according to (1-1) in Example 1. The organic layer was formed in the same manner as that for (1-3) of Example 1, for which, however, the bifunctional urethane acrylate was placed in a monofunctional acrylate (manufactured by Daicel-cytec. Com., ODA-N). By forming an inorganic layer on the formed organic layer according to (1-4) of Example 1, the barrier film of Comparative Example 1 having a structure of the PEN substrate/the organic layer/the inorganic layer was formed.

Comparative Example 2

The barrier film of Comparative Example 2 having a structure of the PEN substrate/the organic layer/the inorganic layer was formed according to the same manner as that for Comparative Example 1, for which, however, the monofunctional acrylate was placed in a bifunctional urethane acrylate (manufactured by Daicel-cytec. Com., EB4858).

Comparative Example 3

The barrier film of Comparative Example 3 having a structure of the PEN substrate/the easy adhesive layer/the organic layer/the inorganic layer was formed according to the same manner as that for Example 1, for which, however, the bifunctional urethane acrylate was placed in a bifunctional acrylate (manufactured by Daicel-cytec. Com., DPGDA).

Comparative Example 4

The barrier film of Comparative Example 4 having a structure of the PEN substrate/the easy adhesive layer (the first layer)/the easy adhesive layer (the second layer)/the organic layer/the inorganic layer was formed according to the same manner as that for Comparative Example 3, for which, however, the easy adhesive layer was altered to the same two layers constitution as that for Example 2.

Test Examples

The water vapor permeability of the barrier films formed in the above Examples and Comparative Examples were determined at 40° C. and a relative humidity of 90%, using a water vapor permeability determining apparatus (manufactured by MOCON, PERMATRAN-W3/31). The measurable limit is 0.005 g/m$^2$/day.

The measure of the barrier films were carried out when the barrier films were not folded, the barrier films were folded in curvature radius of 20 mm (20 mmR), the barrier film were folded in curvature radius of 10 mm (10 mmR) and the barrier film were folded in curvature radius of 5 mm (5 mmR), and the results were shown in Table 1.

Table 1

TABLE 1

| | Easy Adhesive Layer | Monomer of Organic Layer | Ra of Organic Layer (nm) | Permeability (g/m$^2$ · day) | | | |
| --- | --- | --- | --- | --- | --- | --- | --- |
| | | | | Not folded | Folded in curvature radius of 20 mmR | Folded in curvature radius of 10 mmR | Folded in curvature radius of 5 mmR |
| Example 1 | Yes | Bifunctional urethane acrylate | 0.5 | 0.005 | 0.005 | 0.010 | 0.010 |
| Example 2 | Yes | Bifunctional urethane acrylate | 0.3 | 0.005 | 0.005 | 0.005 | 0.005 |
| Example 3 | Yes | Bifunctional urethane acrylate | 0.5 | 0.005 | 0.0065 | 0.010 | 0.010 |
| Comparative Example 1 | No | Monofunctional acrylate | 0.7 | 0.050 | 0.07 | 0.120 | 0.200 |
| Comparative Example 2 | No | Bifunctional urethane acrylate | 0.5 | 0.010 | 0.020 | 0.050 | 0.090 |
| Comparative Example 3 | Yes | Bifunctional acrylate | 0.5 | 0.010 | 0.010 | 0.030 | 0.100 |
| Comparative Example 4 | Yes | Bifunctional acrylate | 0.3 | 0.005 | 0.010 | 0.020 | 0.045 |

As being clear from Table 1, the barrier films of Examples 1 to 3, in which the center liner average roughness of the surface of the organic layer on the inorganic layer side is 0.5 nm or less and the organic layer contains a resin which is obtained by curing a bifunctional urethane acrylate as a polymerizable component, expressed the high water vapor barrier property even if the barrier film is folded. Specifically, for Examples 1 and 2 in which the polyester resin as the binder of the easy adhesive layer is used, the barrier films after being folded have much higher water vapor barrier property. To the contrary, the barrier film of Comparative Example 1 having a center liner average roughness of over 0.5 nm, the barrier film of Comparative Example 2 not having an easy adhesive layer, the barrier film of Comparative Examples 3 and 4 using the bifunctional acrylate for the organic layer in place of the bifunctional urethaneacrylate were poor in the water vapor barrier property after being folded. As above, it was confirmed that, according to the invention, the barrier film in which the organic layer contains the resin obtained by curing the particular urethane acrylate as a polymerizable component, and the center liner average roughness of the organic layer on the inorganic layer side is 0.5 nm or less maintains the high water vapor barrier property when folded.

2. Construction and Evaluation of Organic EL Device
(2-1) Construction of Organic EL Device:

An ITO film-coated conductive glass substrate (surface resistivity, 10 ω/square) was washed with 2-propanol, and then subjected to UV-ozone treatment for 10 minutes. On this substrate (anode), the following organic compound layers were deposited in order according to a vapor deposition method.

| (First Hole Transportation Layer) | |
|---|---|
| Copper Phthalocyanine | thickness 10 nm |
| (Second Hole Transportation Layer) | |
| N,N'-diphenyl-N,N'-dinaphthylbenzidine | thickness 40 nm |
| (Light Emission Layer serving also as electron transportation layer) | |
| Tris(8-hydroxyquinolinato)aluminium | thickness 60 nm |

Finally, lithium fluoride was vapor-deposited in a thickness of 1 nm and metal aluminium was in a thickness of 100 nm in that order, serving as a cathode. On this, a silicon nitride film having a thickness of 5 µm was formed according to a parallel plate CVD method, thereby constructing an organic EL device.

(2-2) Disposition of Gas-Barrier Layer on Organic El Device:

Using a thermosetting adhesive (Daizo-Nichimori's Epotec 310), the device was stuck to the barrier film of Examples 1 and 2, and heated at 65° C. for 3 hours to cure the adhesive. Thus sealed, 20 samples of every organic EL device were constructed.

(2-3) Evaluation of Organic El Device for the Surface Condition with Light Emission:

Immediately after their construction, the organic EL devices were driven for light emission at a voltage of 7V applied thereto, using a source measure unit, Keithley's SMU2400 Model. Using a microscope, the surface of each sample was checked for its condition with light emission, and it was confirmed that all the devices gave uniform light emission with no dark spot.

INDUSTRIAL APPLICABILITY

The barrier film of the invention has too much high water vapor barrier property. Further, the barrier film of the invention can maintain the high water vapor barrier property when folded. Therefore, the barrier film of the invention may be effectively used for wide uses including a flexible organic EL device.

The present disclosure relates to the subject matter contained in Japanese Patent Application No. 128389/2007 filed on May 14, 2007 and, in Japanese Patent Application No. 110476/2008 filed on Apr. 21, 2008, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A barrier film having a structure in which an easy adhesive layer, an organic layer and an inorganic layer are laminated in that order on one surface or both surfaces of a plastic film, wherein a center liner average roughness of a surface of the organic layer on the inorganic layer side is 0.5 nm or less, and the organic layer consists essentially of a resin which is obtained by curing an acrylic monomer having at least two acryloyl groups and at least two urethane groups in one molecule as a polymerizable component.

2. The barrier film according to claim 1, wherein the easy adhesive layer contains polyester resin as a binder.

3. The barrier film according to claim 1, wherein the easy adhesive layer comprises a first layer adjacent to the plastic film and a second layer on the first layer.

4. The barrier film according to claim 1, wherein the easy adhesive layer comprises a first layer adjacent to the plastic film and a second layer on the first layer, the first layer contains a polyester resin as a binder, and the second layer contains an acrylic resin or a urethane resin as a binder.

5. The barrier film according to claim 1, wherein the easy adhesive layer contains a carbodiimide compound.

6. The barrier film according to claim 1, wherein the barrier film after folded in curvature radius of 5 mm has a water vapor permeability of at 0.01 g/m²day or less.

7. The barrier film according to claim 1, wherein the acrylic monomer is represented by the following formula (1):

Formula (1)

wherein Acr is an acryloyl group or a methacryloyl group, n is an integer of 1 to 5, $L^1$ is a bivalent linking group and $L^2$ is a linking group having valence of (n+1).

8. The barrier film according to claim 1, wherein the acrylic monomer is represented by the following formula (1):

Formula (1)

wherein Acr is an acryloyl group or a methacryloyl group, n is an integer of 1 to 5, $L^1$ is a bivalent linking group and $L^2$ is a linking group having valence of (n+1); and $L^1$ is selected from and $L^2$ is selected from 9. The barrier film according to claim 1, wherein the polymerizable component of the organic layer further contains a monofunctional monomer.

10. The barrier film according to claim 1, wherein the organic layer has a thickness of 50 to 5000 nm.

11. The barrier film according to claim 1, wherein the inorganic layer has a thickness of 10 to 300 nm.

12. A device comprising a barrier film according to claim 1.

13. An organic EL device comprising a barrier film according to claim 1.

14. A barrier film having a structure in which an adhesive layer, an organic layer and an inorganic layer are laminated in that order on one surface or both surfaces of a plastic film, wherein a center liner average roughness of a surface of the organic layer on the inorganic layer side is 0.5 nm or less, and the organic layer consists essentially of a resin which is obtained by curing an acrylic monomer having at least two acryloyl groups and at least two urethane groups in one molecule as a polymerizable component.

* * * * *